US006718295B2

(12) United States Patent
Hasegawa

(10) Patent No.: US 6,718,295 B2
(45) Date of Patent: Apr. 6, 2004

(54) SPEECH BAND DIVISION DECODER

(75) Inventor: Satoshi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/186,439

(22) Filed: Nov. 5, 1998

(65) Prior Publication Data
US 2002/0069051 A1 Jun. 6, 2002

(30) Foreign Application Priority Data
Nov. 5, 1997 (JP) .............................. 9-302289

(51) Int. Cl.[7] .............................................. G10L 21/00
(52) U.S. Cl. .................................. 704/200.1; 704/200.1
(58) Field of Search ....................... 704/200.1, 221–230

(56) References Cited

U.S. PATENT DOCUMENTS 5,752,222 A * 5/1998 Nishiguchi et al. ......... 704/223
5,963,596 A * 10/1999 Benbassat et al. ........... 375/243

FOREIGN PATENT DOCUMENTS

| EP | 0 798 869 A2 | 10/1997 |
| JP | 59-178808 | 10/1984 |
| JP | 6-348295 | 12/1994 |
| WO | WO 92/12607 | 7/1992 |

OTHER PUBLICATIONS

Runstein and Huber, Modern Recording Techniques $2^{nd}$ edition, Howard W. Sams. & Co, Inc., pp. 168–172. 1986.*
Broadhead and Dwen "Direct Manipulation of MPEG Compressed Digital Audio", Electronic Proceedings of ACM Multimedia 95, San Francisco, CA, pp. 1–14. Nov. 1995*
Brandenburg et al., "ISO–MPEG–1 Audio : Agenetic Standard for coding of High–Quality Digital Audio" J. Audio Eng. Soc., vol. 42, No. 10, pp. 780–792. Oct. 1994.*
Musman, "The ISO Audio Coding Standard", pp. 511–517, IEEE Globecom, Global Telecommunications Conference & Bxhibiton. Dec. 1990.*
V. Bhaskaran, "Mediaprocessing in the Compressed Domain," Feb. 25, 1996, pp. 204–209, *Proceedings of COMPCON*, IEEE.

* cited by examiner

Primary Examiner—David D. Knepper
(74) Attorney, Agent, or Firm—Foley & Lardner

(57) ABSTRACT

A volume control unit 3 obtains, from a scale factor updating unit 2, data about how much the playback scale factor of sub-bands adjacent to a sub-band to be emphasized has been reduced, and increases the analog audio signal output level of a volume control 77 to an extent corresponding to the playback scale factor necessary for restoring the playback scale factor before the reduction. As a result, the signal level of the desired sub-band (i.e., sub-band to be emphasized) is increased to obtain a sufficient sense of emphasis of the desired sub-band.

12 Claims, 5 Drawing Sheets

PCM AUDIO OUTPUT

SPEECH BAND DIVISION DECODER

BACKGROUND OF THE INVENTION

The present invention relates to speech band division decoders and, more particularly, to speech band division decoders having a tone quality control function.

In the field of signal processing, digital processing of signals has been replacing conventional analog processing owing to the appearance of CPU (central processing unit) and DSP (digital signal processor, which are fast and highly accurate in operation.

In addition, with performance improvement of CPU and DSP, coding and decoding of images and speeches which have been thought to be relatively heavy processes, have been being progressively realized by digital processing. Particularly, in the processing of speeches the tone quality control has become realized digitally.

For example, Japanese Patent Laid-Open Publication No. 59-178808 shows a technique, which uses FFT (Fast Fourier Transform) as digital filter to replace an equalizer which were heretofore constructed as a combination of analog filter, thus dispensing with a number of analog filters heretofore necessary for fine coefficient setting, increasing the available dynamic range which is not so broad due to the characteristics of analog filters and permitting gain setting in correspondence to finer frequency ranges.

FIG. 6 outlines a prior art decoder according to the above technique. In this case, a digital equalizer 55 comprising a decomposing filter 52, a gain controller 53 and a synthesis filter 54, is constructed separately from and combined with a coded data decoder 51 as speech data decoder.

As another technique, Japanese Patent Laid-Open Publication No. 6-348295 shows a commonly termed MPEG/audio decoder prescribed in speech coding/decoding standards ISO/IFC 11172-3, specifically a method of realizing a tone control function of that decoder in conformity to the user's taste with a simple construction by utilizing the algorithmic character of the decoder.

The outline of the above speech coding/decoding standards will now be summarized. The standards prescribes dividing a band division coded signal, obtained by dividing the frequency band of a speech signal into a plurality of sub-bands, coding the individual sub-band signals and combining the coded sub-band signals, into a plurality of sub-bands, changing the scale factor of a predetermined sub-band coded signal, combining the individual coded signals and then analog converting the resultant signal to obtain a speech signal having a predetermined frequency characteristic.

FIG. 7 outlines the disclosed MPEG/audio decoder. The decoder will now be described with reference to the Figure.

An inverse quantizer 61 converts band division coded (or sub-band coded) data to speech data of each sub-band. Then, a gain control circuit 62 controls the gain of each sub-band speech data. A side-band synthesis filter bank 63 then synthesizes the resultant individual side-band speech data. The tone control is executed by duplicating the MPEG/audio algorithm other than the gain control.

The publication noted above also teaches that when each sub-band speech data from the inverse quantizer 61 includes range data representing the sound volume, the tone quality may be controlled by controlling the range data. In the MPEG/audio decoder, the tone control may thus be made by controlling scale factor data representing the playback scale factor of each sub-band.

The construction and operation of an MPEG 1/Audio layer 1 decoder with a tone control function will now be described.

FIG. 8 is a block diagram showing a prior art MPEG 1/Audio layer 1 decoder. The decoder is basically a band division coding (or sub-band coding) system, and thus executes the process in units of sub-bands having an equal bandwidth, for instance of 32 sub-bands.

The MPEG 1/Audio layer 1 decoder 71 comprises a bit stream decomposer 72, an inverse quantizer 73, a sub-band synthesis filter bank 74 and a side-band data decoder 75.

The bit stream decomposer 72 decomposes an MPEG 1/audio bit stream signal supplied to the decoder 71 into a 32-sub-band quantized signal and side-band data as attribute data.

The side-band data decoder 75 decodes the side-band data to restore bit assignment data representing the number of bits assigned to each sub-band (the number of quantization bits being determined by utilizing human's acoustical character, a greater number of bits being assigned to a sub-band containing part important for human's hearing sense, a less number of bits being assigned otherwise) and scale factor data representing the playback scale factor of each sub-band.

The inverse quantizer 73 generates 32-sub-band equal bandwidth sub-band signals from individual signals obtained as a result of the bit stream decomposition. The sub-band synthesis filter bank 74 synthesizes the sub-band signals thus obtained, and thus supplies linear PCM audio data (LPCM). The frequency characteristic of the LPCM that is supplied can be controlled by controlling the playback scale factor of each sub-band.

However, when the scale factor data representing the playback scale factor in the increasing direction, it may happen that a number of bits are necessary, which exceeds a range that the LPCM as the output data of the decoder (for instance 16 bits) can be expressed.

To avoid this, the frequency characteristic of the LPCM is controlled in the direction of reducing the scale factor data, i.e., in the direction of reducing the playback scale factor. When a certain frequency band is to be emphasized, the scale factor data of the other bands is reduced. In this case, however, the gain of the signal of the sub-band to be emphasized is not changed. Therefore, a sufficient sense of emphasis cannot be obtained in this operation alone.

SUMMARY OF THE INVENTION

An object of the present invention, accordingly, is to provide a speech band division decoder, which permits a sense of emphasis of a desired frequency band to be reliably obtained.

According to the present invention, there is provided a speech band division decoder for decomposing a band division coded signal, obtained by dividing a speech signal into a plurality of frequency sub-band signals, coding these signals and synthesizing the coded signals, into a plurality of sub-bands, updating a playback scale factor of a predetermined sub-band coded signal, synthesizing the resultant coded signals and analog converting the resultant signal to obtain a speech signal having a predetermined frequency characteristic, the speech band division decoder further comprising speech signal gain control means for controlling the gain of the analog converted speech signal in the direction of canceling a change in the playback scale factor.

The updating of the playback scale factor reduces the playback scale factor of coded signals of sub-bands adjacent to the predetermined sub-band. The updating of the playback scale factor is executed by updating a scale factor value provided in correspondence to the playback scale factor. The scale factor value is set such that it is reduced by increasing the playback scale factor. The speech band division decoder further comprises scale factor value control means for setting the scale factor to the upper limit when a scale factor value exceeding the upper limit is inputted. The coded signals obtained after the division of the band division code signal into a plurality of sub-bands further includes bit assignment data, the bit assignment being determined according to the hearing characteristic of human. The speech band division decoder further comprises playback scale factor input means or externally updating the playback scale factor.

According to another aspect of the present invention, there is provided a speech band division decoder for synthesizing coded signals of a plurality of frequency bands obtained after changing a playback scale factor of a predetermined frequency band to obtain a speech signal having a predetermined frequency characteristic, wherein the gain of output of the synthesized coded signal is controlled in the direction of canceling a change in the playback scale factor.

The synthesized coded signal is converted into an analog signal and the gain of the converted analog signal is controlled in the direction of canceling a change in the playback scale factor.

According to other aspect of the present invention, there is provided a speech band division decoder comprising: a bit stream decomposer for decomposing an MPEG 1/audio bit stream signal into a plurality of frequency sub-band quantized signal and side-band data as attribute data; a side-band data decoder for decoding the side-band data to restore bit assignment data representing the number of bits assigned to each sub-band and scale factor data representing a playback scale factor of each sub-band; an inverse quantizer for inversely quantizing the decomposed signal and generating a plurality of sub-band signals; a sub-band synthesis filter bank for synthesizing the obtained sub-band signals; a scale factor updating unit for updating the scale factor data supplied from the side-band data decoder; and a volume control unit for controlling the output volume of the sub-band synthesis filter bank on the basis of the output from the scale factor updating unit.

According to still another aspect of the present invention, there is provided a speech band division decoder comprising: a bit stream decomposer for decomposing an MPEG 1/audio bit stream signal into a plurality of frequency sub-band quantized signal and side-band data as attribute data; a side-band data decoder for decoding the side-band data to restore bit assignment data representing the number of bits assigned to each sub-band and scale factor data representing a playback scale factor of each sub-band; an inverse quantizer for inversely quantizing the decomposed signal and generating a plurality of sub-band signals; a sub-band synthesis filter bank for synthesizing the obtained sub-band signals; a scale factor updating unit for updating the scale factor data supplied from the side-band data decoder; an A/D converter for converting the output of the sub-band synthesis filter bank and input; and a volume control unit for controlling the output volume of the A/D converter on the basis of the output from the scale factor updating unit.

The speech band division decoder further comprises an input unit for externally updating the scale factor data.

In the present invention, the gain of the speech signal obtained after the analog conversion is controlled in the direction of canceling the playback scale factor change. That is, a sense of emphasis of a desired frequency band can be obtained by reducing the playback scale factors of adjacent frequency band coded signals and increasing the gain of the speech signal obtained after the analog conversion.

Other objects and features will be clarified from the following description with reference to attached drawings.

PREFERRED EMBODIMENTS OF THE INVENTION

Preferred embodiments of the present invention will now be described with reference to the drawings.

Figure 1:
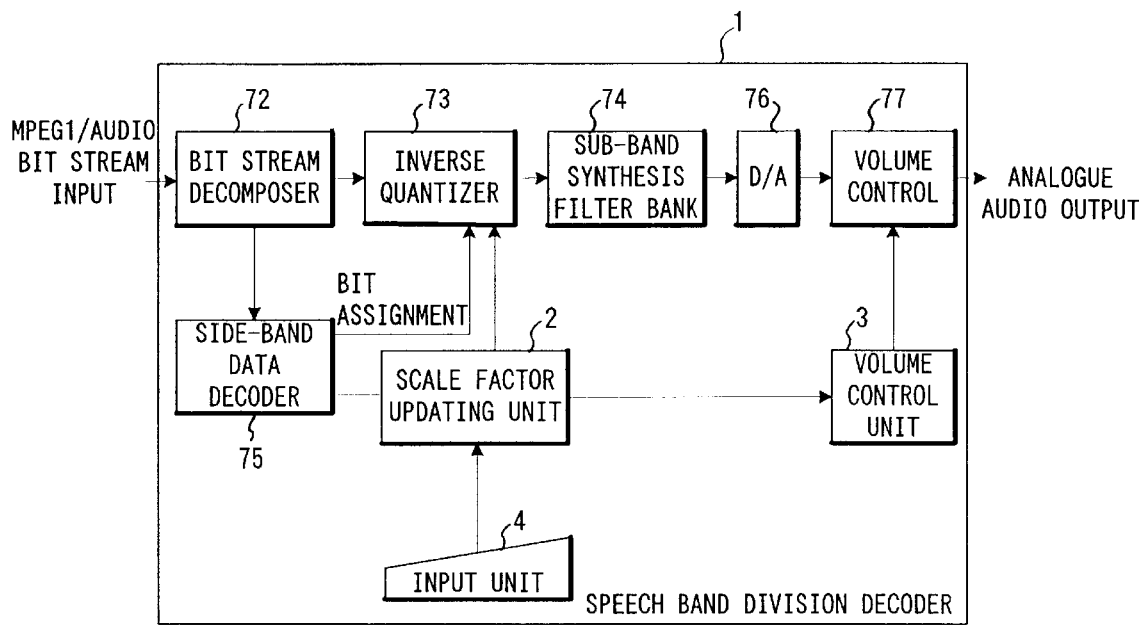
FIG. 1 shows a block diagram showing an embodiment of the speech band division decoder according to the present invention.
Figure 8:
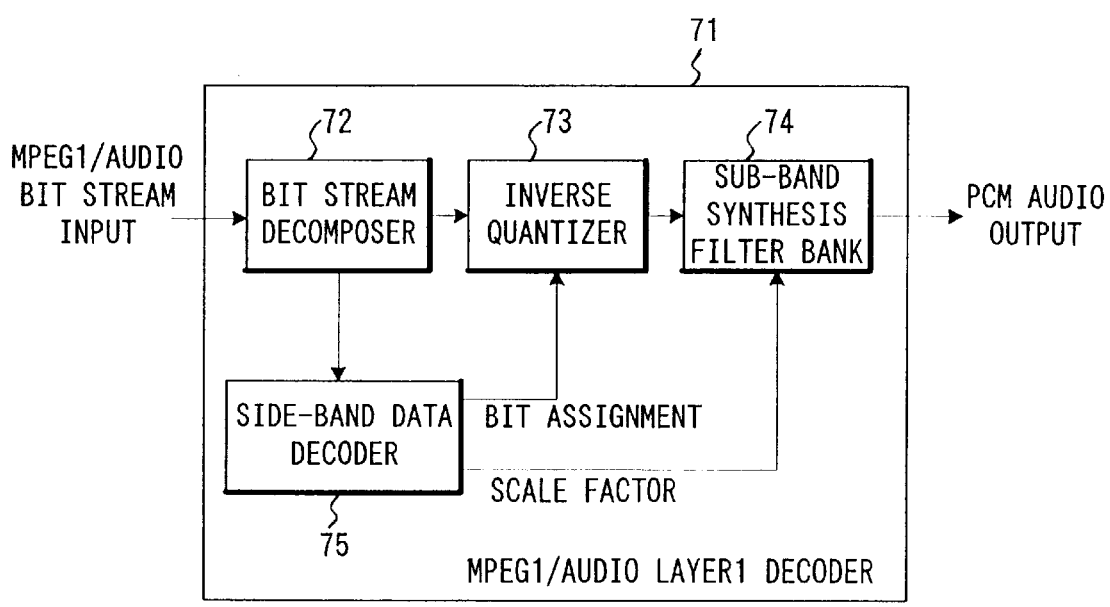
FIG. 8 shows a block diagram showing a prior art MPEG 1/Audio layer 1 decoder.

FIG. 1 is a block diagram showing the best embodiment of the speech band division decoder according to the present invention. In the Figure, parts like those in the prior art example (FIG. 8) are designated by like reference numerals, and are not described.

The speech band division decoder 1 according to the present invention is different from the prior art example in that it comprises, in addition to the components in the prior art example, a scale factor updating unit 2 for updating the scale factor data supplied from the side-band data decoder 75, a volume control unit 3 for controlling a volume control 77 to be described later by obtaining, from the scale factor updating unit 2, data of how the playback scale factor of which sub-band has been changed, and an input unit 4 for externally updating the scale factor data. The Figure further shows, for the sake of convenience, D/A (digital-to-analog) converter 76 and volume control 77, which are dispensed with in the prior art.

The operation will now be described. The operation of the parts common to the prior art example, which has been described, are not described here, and only the operation of parts pertaining to the present invention will be described.

First, a sub-band to be emphasized is determined. Then, the scale factor updating unit 2 obtains, from the side sub-band data decoder, scale factor data of the sub-bands adjacent to the pertinent sub-band, and reduces the scale factor data, i.e., the playback scale factor, of these sub-bands to as necessary extent. As a result, the playback scale factor of the sub-bands adjacent to the sub-band to be emphasized becomes lower than the scale factor of the sub-band to be emphasized. In this way, the pertinent sub-band is emphasized in the hearing sense.

The quantized signals of all the sub-bands including sub-bands, the playback scale factor of which has been updated, are coupled through the inverse quantizer 73 to the sub-band synthesis filter bank 74 and composed. The resultant signal is analog converted through the D/A converter 76 to an analog audio signal, which is provided through the volume control 77.

In the operation as described above, however, the gain (or playback scale factor) of the signal of the sub-band to be emphasized is not changed. Therefore, a sufficient sense of emphasis cannot be obtained in this operation alone. According to the present invention, the volume control unit 3 obtains, from the scale factor updating unit 2, data about the reduction of the playback scale factor of the adjacent sub-bands noted above (i.e., sub-bands adjacent to the sub-band to be emphasized), and causes the volume unit 77 to increase the analog audio signal output level thereof to an extent corresponding to the playback scale factor necessary for restoring the playback scale factor before the reduction. The level increase may be such as to exceed the playback scale factor necessary for the restoration of the playback scale factor before the reduction. It is thus possible to obtain a desired sense of emphasis of the pertinent sub-band. Also, the scale factor data may be externally changed by supplying necessary scale factor data from the input unit 4 to the scale factor updating unit 2.

Figure 2:
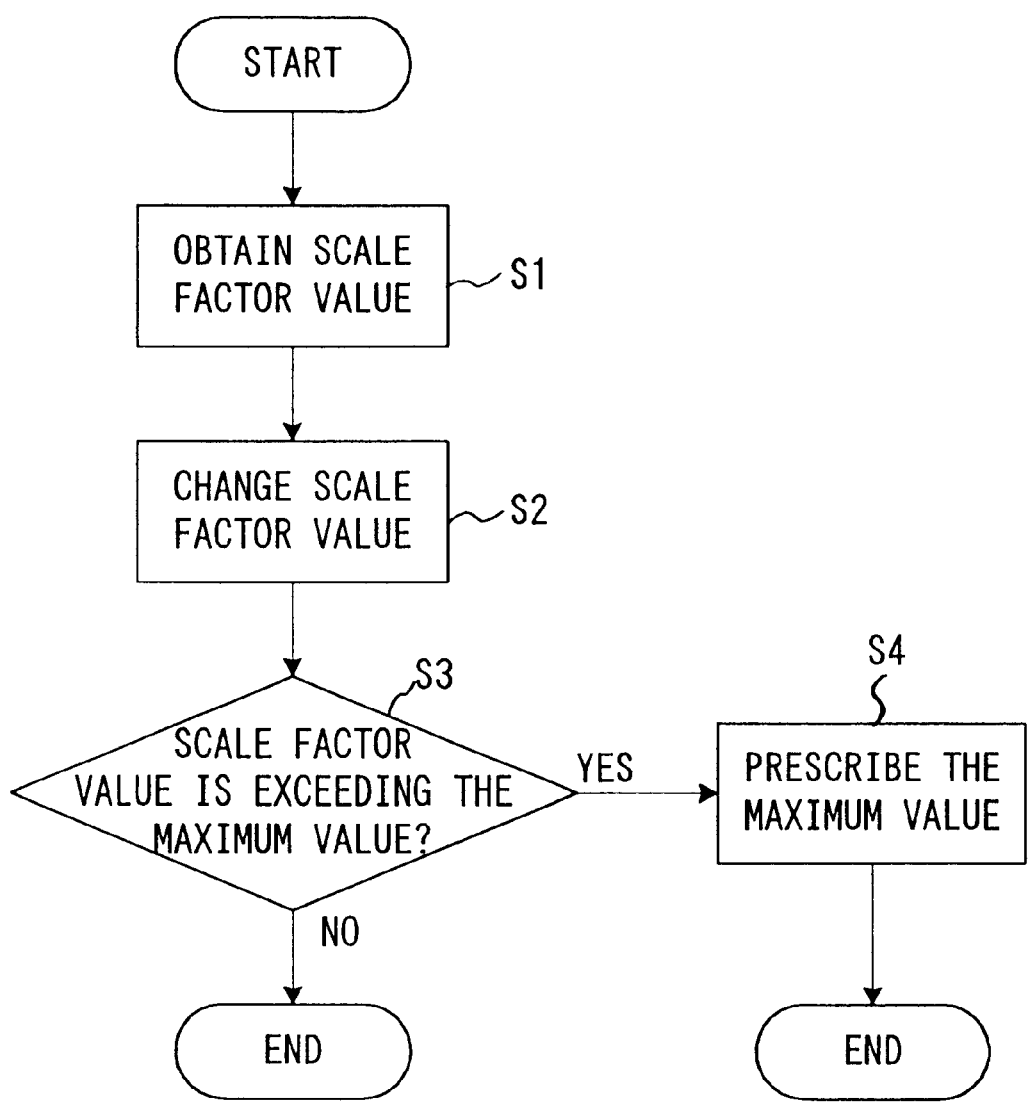
FIG. 2 shows a flow chart illustrating the operation of the embodiment.
Figure 3:
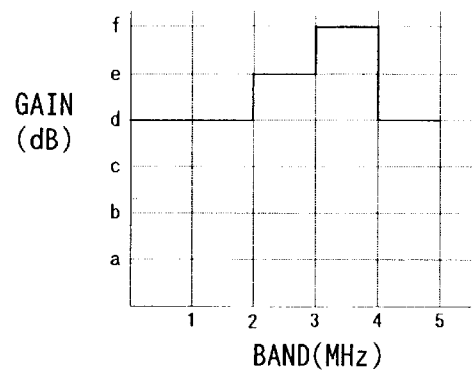
FIGS. 3 to 5 show characteristics in a case with a total sub-band number of 5.
Figure 4:
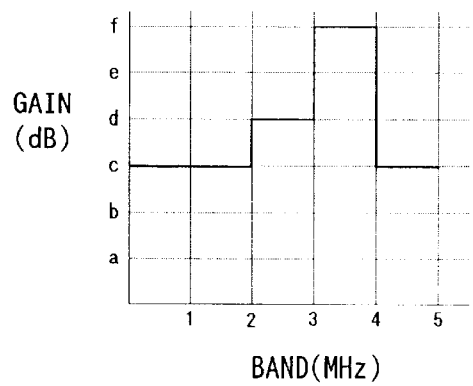
Figure 5:
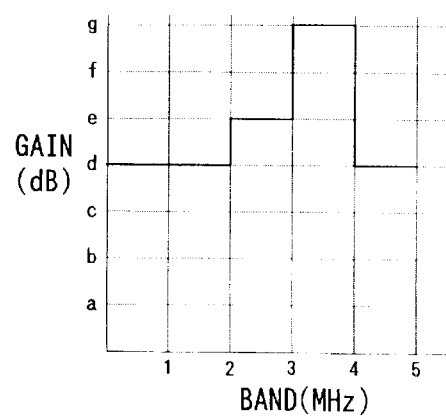
Figure 6:
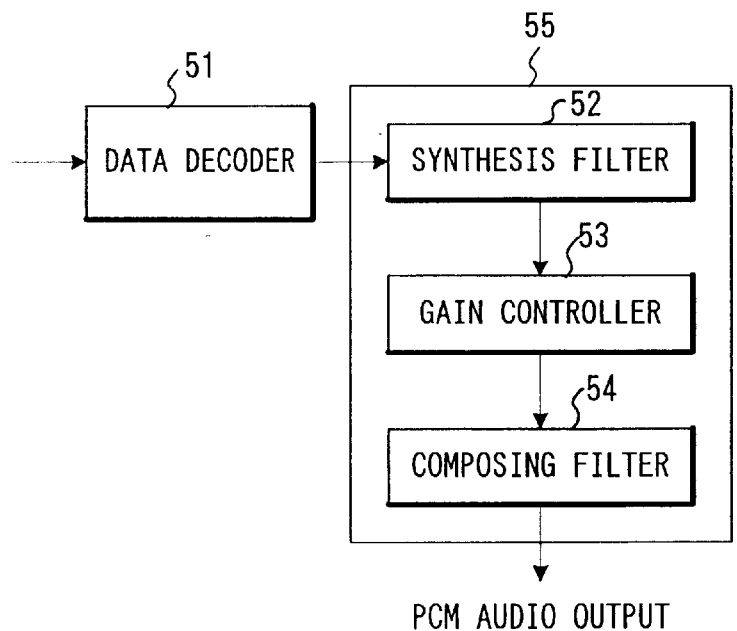
FIG. 6 shows a block diagram of a prior art decoder.
Figure 7:
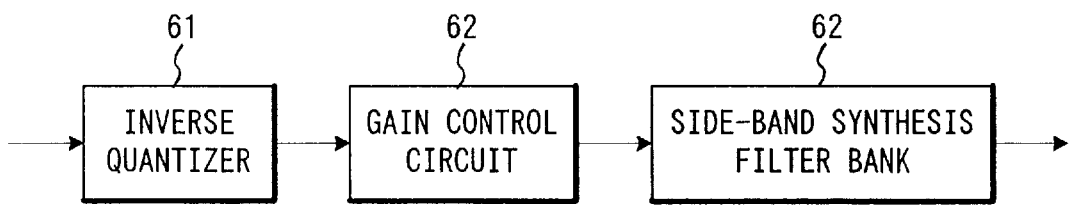
FIG. 7 shows a block diagram of a prior art MPEG/audio decoder.

FIG. 2 is a flow chart illustrating the operation of the embodiment. FIGS. 3 to 5 are graphs showing gain versus frequency (or sub-band) characteristics.

Since the embodiment is the same in construction as the best form of mode described above (FIG. 1), FIG. 1 is also referred to as well.

The scale factor updating unit 2 updates the scale factor data, which is obtained as a result of decoding in the side sub-band data decoder 75 and represents the playback scale factor of each sub-band. Layer 1 has prescribed scale factor values, i.e., 63 from "0" to "62", and whenever the scale factor number is reduced by "1", the playback scale factor is increased by 2 dB. The playback scale factor has a maximum value of 2.0 (times) when the scale factor number is "0" and minimum value of 0.00000120155435 (times) when the scale factor number is "62"). An operation mode for decreasing the gain of a certain sub-band by 4 dB as desired by the user, will now be described with reference to FIG. 2.

When a scale factor value obtained as a result of decoding in the side sub-band data decoder 75 is supplied to the scale factor updating unit 2 (step S1), it is updated to a scale factor value as desired by the user. For example, when the obtained scale factor value of a certain sub-band is "20", it is updated to 20+2=22 for the gain reduction by 4 dB (step S2). Since the scale factor value is prescribed to be in a range of "0" to "62", a check is then made as to whether the updated scale factor value is not exceeding the maximum value of "62" (step S3). Since in this example the updated scale factor value is not exceeding "62", an end is brought to the routine, and the updated scale factor is delivered to the inverse quantizer 73 and used for the inverse quantization therein.

In a case when the scale factor value of a certain sub-band, obtained from the side sub-band data decoder 5, is "61", however, for the gain reduction by 4 dB the calculated scale factor value is 61+2=63 and exceeds the prescribed range. In such a case, the maximum scale factor value of "62" is set (step S4).

As shown above, the gain of each sub-band can be updated by updating the scale factor value. When it is desired to emphasize, for instance, the 4-th sub-band, the gain data of adjacent sub-bands is reduced, thus obtaining apparent emphasis of the 4-th sub-band compared to the adjacent sub-bands.

In such a state, however, the gain of the 4-th sub-band is not actually changed, while the gain of the adjacent sub-bands is reduced. In this case, the overall gain is reduced, and it is difficult to obtain a sense of emphasis of the 4-th sub-band as desired by the user from the LPCM finally provided from the sub-band synthesis filter bank 74. Accordingly, the LPCM output of the sub-band synthesis filter bank 74 has been converted in the A/D converter 76 to an analog audio signal, the following process is executed.

The volume control unit 3 obtains, from the scale factor updating unit 2, data about how the sub-band to be emphasized has been emphasized, i.e., how the gain of the sub-bands adjacent to the sub-band to be emphasizes has been reduced, and controls according to this data the volume control 76 in the direction of increasing the analog audio signal output gain. In this operation, a sense of emphasis of the pertinent sub-band as desired by the user can be obtained.

This operation will now be described with reference to FIGS. 1 and 3 to 5. FIGS. 3 to 5 show characteristics in a case with a total sub-band number of 5.

FIG. 3 shows sub-band data without scale factor control. In the Figure, the ordinate is taken for the gain (in dB), and the abscissa is taken for the frequency (in MHz). The numerals provided along the abscissa axis represent the serial numbers of the sub-bands. This is the same in FIGS. 4 and 5 as well.

Referring to FIG. 3, the gains of the 1-st to 5-th sub-bands are d, d, e, f and d (d<e<f) (dB), respectively.

When the 4-th band is emphasized with sub-band gain control in the scale factor updating unit 2, gains of other sub-bands is reduced to obtain in a state as shown in FIG. 4. This state is the gain distribution of the analog audio signal provided from the D/A converter 6. As shown in the Figure, the gains of the 1-st to 3-rd and 5-th sub-bands are reduced to c, c, d and c (c<d) (dB), respectively.

This state, however, is obtained without gain control of the 4-th sub-band itself. Therefore, it is difficult to obtain a sufficient sense of emphasis of that sub-band. Accordingly, the volume control unit 3 receives sub-band gain control data from the scale factor updating unit 2, and controls the volume control 77 according to this data.

The final analog audio signal output of the volume control 77 has a gain distribution as shown in FIG. 5. In this state, the 4-th sub-band is emphasized as desired. Specifically, as shown in the Figure the gains of the 1-st to 5-th sub-bands are d, d, e, g and d (f<g) (dB), respectively, that is, the gains of all the sub-band, including the 4-th sub-band, are increased.

The hearing sense of human has frequency bands which can be readily perceived even with low gain and those which can be difficulty perceived unless the gain is increased. This is shown by a commonly termed Fretchermanson curve or a curve called hearing threshold. The volume control unit 3 utilizes this hearing characteristic of human to control the volume control 3 in dependence on the frequency band to be emphasized as desired by the user. The user thus can more efficiently obtain a sense of emphasis of a desired frequency band.

While an example of equalizer process in the MPEG/Audio layer 1 has been described, the process in the MPEG/Audio layer 1 is by no means limitative, and similar effects are obtainable by utilizing the process system according to the present invention so along as the concerned algorithm is such that sub-band coding of MPEWG/Audio layer 2 or the like is utilized and that a scale factor as playback scale factor data of each sub-band is present in a bit stream or generated in a decoding process.

As has been described in the foregoing, the speech band division decoder according to the present invention is provided for decomposing a band division coded signal, obtained by dividing a speech signal into a plurality of frequency sub-band signals, coding these signals and comprising the coded signals, into a plurality of sub-bands, updating a playback scale factor of a predetermined sub-band coded signal, then synthesizing the resultant coded signals and analog converting the resultant signal to obtain a speech signal having a predetermined frequency characteristic. The speech band division decoder further comprises speech signal gain control means for controlling the gain of the analog converted speech signal in the direction of canceling a change in the playback scale factor. It is thus possible to obtain a sufficient sense of emphasis of the desired sub-band.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A speech band division decoder for decomposing a band division coded signal obtained by dividing a speech signal into a plurality of frequency sub-band signals, coding these signals and synthesizing the coded signals into a plurality of sub-bands, updating a playback scale factor of a predetermined sub-band coded signal by reducing the playback scale factor of coded signals of sub-bands adjacent to the predetermined sub-band to emphasize the predetermined sub-band, synthesizing the resultant coded signals, and analog converting the resultant signal to obtain a speech signal having a predetermined frequency characteristic, the speech band division decoder further comprising speech signal gain control means for controlling the gain of the analog converted speech signal to increase an analog audio signal output level of the analog converted speech signal responsive to the reduction of the scale factors of the adjacent sub-bands.

2. The speech band division decoder according to claim 1, wherein the updating of the playback scale factor is executed by updating a scale factor value provided in correspondence to the playback scale factor.

3. The speech band division decoder according to claim 2, wherein reducing the scale factor value of a sub-band increases the playback scale factor of the sub-band.

4. The speech band division decoder according to claim 2, in which an upper limit scale factor is set, and which further comprises scale factor value control means for setting the scale factor to the upper limit when a scale factor value corresponding to a scale factor exceeding the upper limit is inputted.

5. The speech band division decoder according to claim 1, wherein the coded signals obtained after the division of the band division code signal into a plurality of sub-bands further includes bit assignment data, the bit assignment being determined according to the hearing characteristic of human.

6. The speech band division encoder according to claim 1, which further comprises playback scale factor input means for externally updating the playback scale factor.

7. A speech band division decoder for synthesizing coded signals of a plurality of frequency bands obtained after changing a playback scale factor of a predetermined frequency band to obtain a speech signal having a predetermined frequency characteristic emphasizing the predetermined frequency band by reducing the playback scale factors of coded signals of sub-bands adjacent to the predetermined frequency band, wherein the output gain of the synthesized coded signal is controlled to increase an analog audio signal output level of the synthesized coded signal responsive to the reduction of the scale factors of the adjacent sub-bands.

8. A speech band division decoder comprising:
a bit stream decomposer for decomposing an MPEG 1/audio bit stream signal into a plurality of frequency sub-band quantized signals and side-band data as attribute data;
a side-band data decoder for decoding the side-band data to restore bit assignment data representing the number of bits assigned to each sub-band and scale factor data representing a playback scale factor of each sub-band;
an inverse quantizer for inversely quantizing the decomposed signal and generating a plurality of sub-band signals;
a sub-band synthesis filter bank for synthesizing the obtained sub-band signals;
a scale factor updating unit for updating the scale factor data supplied from the side-band data decoder by reducing the playback scale factor of sub-bands signals adjacent to a predetermined sub-band to emphasize the predetermined sub-band; and
a volume control unit for controlling the output volume of the sub-band synthesis filter bank on the basis of the output from the scale factor updating unit to increase an analog audio signal output level of the sub-band synthesis filter bank responsive to the reduction of the scale factors of the adjacent sub-bands.

9. A speech band division decoder comprising:
a bit stream decomposer for decomposing an MPEG 1/audio bit stream signal into a plurality of frequency sub-band quantized signal and side-band data as attribute data;
a side-band data decoder for decoding the side-band data to restore bit assignment data representing the number of bits assigned to each sub-band and scale data representing a playback scale factor of each sub-band;
an inverse quantizer for inversely quantizing the decomposed signal and generating a plurality of sub-band signals;
a sub-band synthesis filter bank for synthesizing the obtained sub-band signals;
a scale factor updating unit for updating the scale factor data supplied from the side-band data decoder by reducing the playback scale factor of sub-band signals adjacent to a predetermined sub-band to emphasize the predetermined sub-band;
an A/D converter for converting the output of the sub-band synthesis filter bank and input; and
a volume control unit for controlling the output volume of the A/D converter on the basis of the output from the scale factor updating unit to increase an analog audio signal output level of the AD converter output signal responsive to the reduction of the scale factors of the adjacent sub-bands.

10. The speech band division decoder according to claim 8, further comprises an input unit for externally updating the scale factor data.

11. The speech band division decoder according to claim 8 or 9, further comprising an input unit for externally updating the scale factor data.

12. A method of emphasizing a specific frequency band in a band division coded signal, said method comprising:

dividing a speech signal into a plurality of frequency sub-band signals;

coding said sub-band signals;

updating a playback scale factor of the coded signal corresponding to a predetermined sub-band by reducing the playback scale factor of coded signals corresponding to sub-bands adjacent to the predetermined sub-band to emphasize the predetermined sub-band;

synthesizing the coded signals and analog converting the resultant signal to obtain a speech signal having a predetermined frequency characteristic; and controlling the gain of the analog converted resultant speech signal to increase an analog output level of the speech signal responsive to the reduction of the scale factors of the adjacent sub-bands.

* * * * *